United States Patent
Nakanishi et al.

(10) Patent No.: US 6,497,517 B1
(45) Date of Patent: Dec. 24, 2002

(54) LIGHT-RECEIVING MODULE FOR OPTICAL FIBER TRANSMISSION WITH MESH SHIELDING CONDUCTOR

(75) Inventors: Hiromi Nakanishi, Osaka (JP); Yoshiki Kuhara, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/576,068

(22) Filed: May 22, 2000

(30) Foreign Application Priority Data

May 28, 1999 (JP) ............................................. 11-049566

(51) Int. Cl.⁷ .............................. G02B 6/12; G02B 6/36
(52) U.S. Cl. ............................... 385/92; 385/14; 385/94
(58) Field of Search ............................... 385/14, 92, 94

(56) References Cited

U.S. PATENT DOCUMENTS

| | | | | |
|---|---|---|---|---|
| 5,394,014 A | * | 2/1995 | Ishikawa et al. | 257/790 |
| 5,416,871 A | * | 5/1995 | Takahashi et al. | 385/14 |
| 5,737,467 A | * | 4/1998 | Kato et al. | 385/92 |
| 6,234,686 B1 | * | 5/2001 | Tonai et al. | 385/94 |

* cited by examiner

*Primary Examiner*—Georgia Epps
*Assistant Examiner*—Alicia M Harrington
(74) *Attorney, Agent, or Firm*—Smith, Gambrell & Russell, LLP

(57) ABSTRACT

The invention provides an inexpensive and small-sized light-receiving module having high performance, including a light receiving part consisting of a photodiode or a photodiode and an amplifier, and a mechanism for coupling an optical fiber end to the light receiving part; wherein the light receiving part is electrically shielded by a conductive member having openings to interrupt outside noise, and both the light receiving part and conductive member are shielded by a resin mold for integration.

10 Claims, 17 Drawing Sheets

LIGHT-RECEIVING MODULE FOR OPTICAL FIBER TRANSMISSION WITH MESH SHIELDING CONDUCTOR

BACKGROUND OF THE INVENTION

1. Field of the Invention

The present invention relates to a light-receiving module which receives light signals in optical fiber transmissions. In particular, the invention achieves an improvement of inexpensive resin-molded package elements, and it is therefore an object of the invention to provide a resin-molded package having a structure by which the light receiving part is protected from external noise.

2. Prior Art

In a light-receiving module of a prior art, a receiving photodiode (PD module: as shown in FIG. 1) was housed and shielded in an expensive metallic casing.

A description is given of a light-receiving module of a prior art. In a PD module 15 in FIG. 1, a PD chip 17 is fixed at the middle of the upper surface of a metallic disk stem 16. A metallic cap 18 is fixed on the stem 16. A metallic cylindrical lens holder 19 is welded to the stem 16 so that it encloses a cap 18. Also, a conical type ferrule holder 20 is fixed on the lens holder 19.

A metallic ferrule 22 is fixed at the tip end of an optical fiber 21. The ferrule 22 is inserted into a top hole of the ferrule holder 20, and fixed therein. The tip ends of the optical fiber and ferrule are polished to be slant so that no reflected returning light enters an LD.

The PD module 15 is accommodated in a metallic casing consisting of a metallic stem 16, metallic lens holder 19 and metallic ferrule holder 20. The light receiving part is likely to be influenced by peripheral noise since the impedance thereof is high and the signal current thereof is small. However, since the light receiving part is covered by a metallic can, it is possible to be electrically shielded from peripheral noise.

An amplification circuit which amplifies the light current connects the PD module. This is also accommodated in a metallic casing and is designed to be resistant to noise. FIG. 2 shows an example of such a light receiving circuit. A wiring pattern is depicted on an epoxy circuit substrate 30. The lead pins of the PD 15 housed in a metallic can in FIG. 1 is inserted into a wiring pattern 32 of the substrate 30 and soldered therein. An amplification circuit 31 connected the wiring pattern 32 is also an element covered by a metallic casing. The metallic casing is connected to a ground terminal on the circuit substrate. A wire 33 extending from an amplification circuit 31 enclosed by a metallic casing is connected to an output circuit and a power source.

Since, in the light receiving part, the signal current is low and the amplification is high, the light receiving part is apt to receive noise. As regards the prior art light-receiving module, the PD module, drive circuit, and amplification circuit are individually housed in separate casings. Therefore, even though the light-receiving module receives light in an external surrounding where noise exists, there is almost no influence where external noise reaches and is mixed with weak receiving signals.

Where the PD module in FIG. 1 is used, there is no invasion of external noise into the PD (light receiving part) circuit. However, there are a considerable number of elements and parts. It is necessary for wires to be printed on a printed substrate 30. The amplification circuit 31 enclosed by a metallic casing is soldered thereto, and a pin of the PD module housed in a metallic can in FIG. 1 is further soldered thereto. As described above, amplification circuit elements housed in independent metallic cans are required, and printed substrates are also required. That is, the number of components is increased, thereby causing an increase in the production cost.

There are still further problems even in the module in FIG. 1, one of which is that the stem face and the optical fiber direction are vertical, and the other of which is that of light propagating in space over a considerable distance in a package. Therefore, a lens 26 is also required. The PD module is large-sized, and the light-receiving module in which an amplification part is incorporated will become large-sized as shown in FIG. 2. The size of the light-receiving module will inevitably increase.

Further, since expensive metallic packages are used for PD and circuits such as an amplification circuit, production cost is increased. Insofar that an expensive and large-sized light-receiving module is used, light transmission cannot extend to general household use. It is essential that light-receiving modules are small-sized and inexpensive in order to allow extensive use of light transmission to include general household use. If individual components are housed in expensive metallic packages, low cost construction is difficult. Further, in view of making them small-sized, it is preferable that the PD and amplifier (AMP) are not separate from each other.

SUMMARY OF THE INVENTION

Recently, an attempt has been made to achieve a small-sized and inexpensive product by mounting a waveguide (or optical fiber), PD chip and AMP chip on one substrate. A PD and amplifier are mounted on one substrate, and light is caused to propagate in parallel on the substrate. Since a waveguide or an optical fiber, and a PD and an amplifier are mounted on a planar substrate, this is called "planar mounting". The example is illustrated in FIG. 3 (Plan view) and FIG. 4 (Cross-sectional view). A light waveguide 44 is formed on an Si bench 42, and a PD 47 is placed on the termination end, and an amplifier (AMP) 48 chip is provided on the same substrate 42.

The termination end of an optical fiber 49 is connected to the end of the light waveguide 44. Light propagating through the optical fiber 49 is input from the light waveguide 44 to the waveguide-type light-receiving layer of the PD 47. That is, the light is converted to photocurrents. The photocurrents are immediately amplified by the amplifier 48. Since light signals of the PD are directly amplified beforehand without routing in any unnecessary wiring, the light signals have high resistance against noise.

Since the waveguide or optical fiber, PD and amplifier are placed on one substrate, the optical receiving module can be small-sized and lightweight. Since the chips themselves are small, they can be disposed adjacent to each other, whereby the elements can be made further small-sized. The number of packages (casings) is also reduced one, and the cost thereof can be decreased. If a ceramic package is employed with a reduced number of packages, the hermeticity can be improved. However, the cost is not reduced. One of the most inexpensive packages is a commonly available resin mold. Therefore, it is highly advantageous to employ a resin mold package in order to reduce the production cost.

In such a pattern where the receiving signal light of the PD is intense (that is, a short-range transmission), it will cause almost no problem. However, as the receiving signals become weak due to long-range transmission, the problem of noise occurs. If only a resin mold is employed, there is no shielding effect against external noise. Since the input impedance is high with a high amplification ratio noise is likely to be detected despite the light receiving part consisting of a PD and an amplifier. That is, the light receiving part is of a structure that is liable to be affected by noise, and sufficient reception cannot be obtained with respect to weak signals since noise is not shielded. It is therefore an object of the invention to provide an inexpensive and small-sized light-receiving module which resolves such problems, and protect the light receiving part thereof from external noise.

A light-receiving module according to the invention has an optical fiber or a light waveguide, a light receiving element PD and an amplifier (AMP), wherein the light receiving part is covered by a conductive material having openings through which resin can pass, for example, a metallic plate, metallic meshed member, metallic porous plate having a plurality of pores, and the light receiving part, metallic meshed member and metallic porous plate are covered and molded by resin, and all of these are integrated as one unit.

In the invention, the light receiving part is covered by a conductive material having openings through which resin passes, for example, folded metallic plate, porous metallic plate, and metallic meshed member, thereby electrically shielding the light receiving part from the outside. That is, the light receiving part is electrically shielded from external intensive electric waves by the open folded metallic plate, metallic meshed member, or porous metallic plate. The light receiving part is electrically shielded by the open folded metallic plate, metallic meshed member, or porous metallic plate because the light receiving part is densely covered by a molding material invading the interior through the openings (pores). Although mere shielding may be made sufficient by putting a metallic cap over the light receiving part, if the light receiving part is shielded by a metallic cap, no resin can be inserted into the light receiving part in the process of molding, wherein the light receiving part cannot be molded by resin. In the invention, the light receiving part is covered by a metallic plate having openings, wherein fluid resin is inserted from the outside into the light receiving part through the openings and is solidified therein. That is, fluid resin is supplied, and the light receiving part is electrically shielded by a metallic plate having openings, a meshed member, or porous metallic plate to mold the light receiving part. While large numbers of openings and openings large in diameter facilitate the insertion of resin into the interior, oversized pores reduce the ability to shield electric waves. Therefore, the number of pores, and the size thereof are adequately determined by the viscosity of fluid resin and the noise level. While it is preferable that the light receiving part is covered by a metallic part in the case of a ceramic package, the ceramic package is costly. The elements of the invention are packaged by a mold type package specifically to reduce the production cost. Also, in order to prevent external noise from entering, it is strongly recommended that the light receiving part be shielded by placing the PD and AMP (amplifier) as close together as possible. The mold type enables an equivalent outer form of the package to the prior art packages to be made while shielding the PD and AMP in the closest position.

Where the PD and AMP (amplifier) are integrated in the light-receiving module as shown in FIGS. 3 and 4, they can be made smaller-sized than separated PD and AMP as in FIGS. 1 and 2. For example, even though the PD and AMP are integrated and constructed as shown in FIGS. 3 and 4, it is costly if a ceramic package is used. However, since a resin-molded package is employed in the invention, without the use of any ceramic package, the cost of the package is reduced. Further enhanced from the states shown in FIGS. 3 and 4, external noise is prevented from permeating by covering the light receiving part with a metallic plate having openings, a metallic meshed member or porous metallic plate. There are two modes in coupling with optical fibers, one of which is a waveguide type (a) in which a light waveguide is formed on a substrate, and the other a V-grooved type (b) in which an optical fiber ribbon is fixed in a V-shaped groove. The invention is applicable to any one of these types.

(a) Waveguide type (FIGS. 5 and 6) . . . A PD chip 47 and an amplifier chip 48 are provided on a substrate 42 in parallel. A light waveguide 44 is provided on the substrate 42. The end face of the optical fiber 49 is connected to the starting end of the light waveguide 44, and the PD 47 is coupled to the termination end of the light waveguide 44. The PD 47 and amplifier 48 are covered by a porous metallic plate (herein, a meshed member 53) in order to prevent from permeation of external noise.

(b) V-grooved type (FIGS. 7 and 8) . . . A PD chip 47 and an amplifier chip 48 are provided on a substrate 42 in parallel. A V-shaped groove 45 is provided on the substrate 42. The ribbon 46 which is obtained by unsheathing the optical fiber 49 is fixed in the V-shaped groove 46. The PD 47 is coupled to the termination end of the ribbon 46. The PD 47 and AMP 48 are covered y a porous metallic plate (herein, a meshed member) to prevent from permeation of external noise.

The present invention may be applicable to either (a) or (b). In the invention, an optical fiber or a light waveguide, PD and AMP are fixed on the same substrate. And further, they are resin-molded to cover the light receiving part by a porous metallic plate. Therefore, the invention can provide a small-sized and inexpensive light-receiving module having high reliability.

The feature of the invention resides is that the light receiving part is electrically shielded by a conductive body having open portions and is resin-molded. The feature of a light-receiving module according to the invention is that the light receiving part is covered by a metallic meshed member, a porous metallic plate, or a metallic plate, etc., whereby external electric waves can be divert d so as not to enter the light receiving part as noise. Since the noise level is low, the reception is heightened. Further, the light-receiving module being planar mounting type facilitates its production. Also, small-size can be achieved since a planar mounting type optical fiber and light receiving part are secured the same substrate. Still further, since a light-receiving module according to the invention is of a resin-mold type, production cost can be reduced. In line with prevailing optical transmission networks, a low cost module Is essential. That is, by the invention, a noise-suppressed and small-sized light-receiving module having high performance can be industrially mass-produced at a low production cost.

PREFERRED EMBODIMENT OF THE INVENTION

There are many modes in terms of a porous metallic plate, and there may be several types of support systems. Therefore, a description is given below of some examples.

EMBODIMENT 1

Metallic Meshed Member+Support: Light Waveguide

Figure 1:
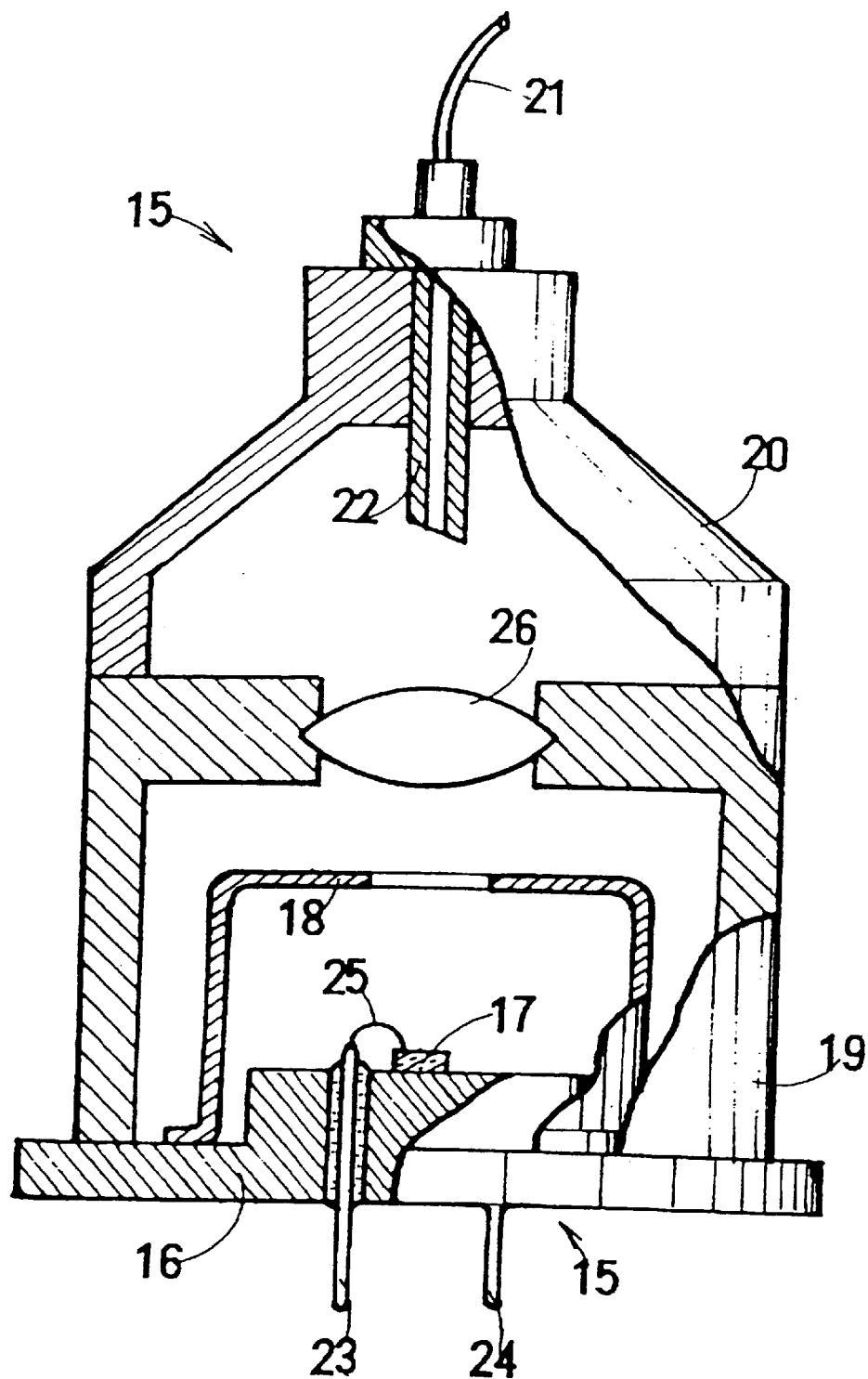
FIG. 1 is a longitudinally sectional view of a PD module according to a prior art example housed in a metallic casing.
Figure 2:
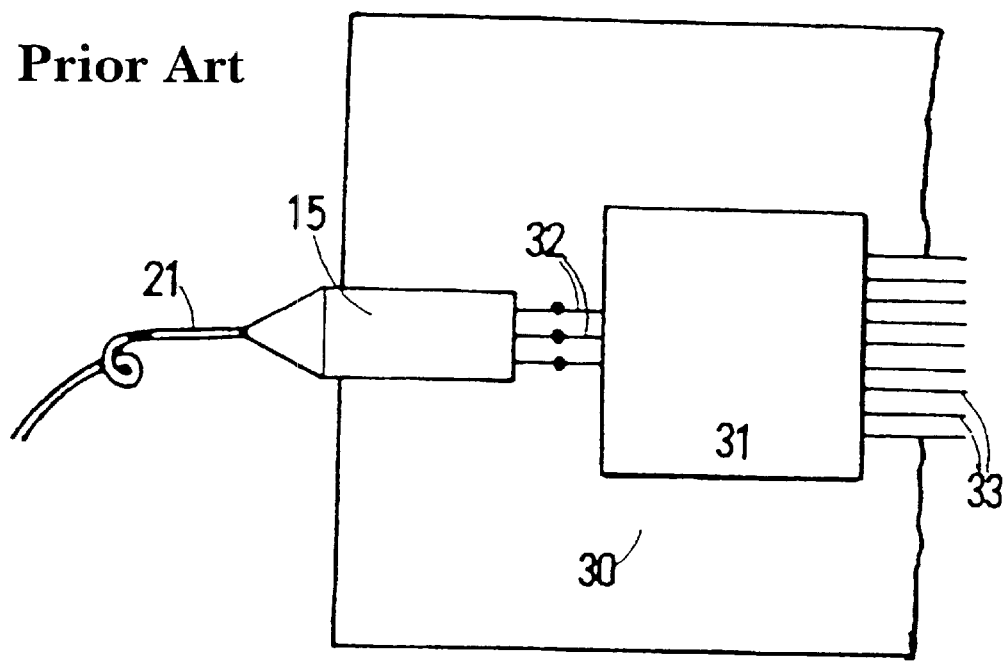
FIG. 2 is a plan view showing a prior art example of a receiving module in a state where a metallic casing PD module and a circuit substrate provided with an amplification circuit are coupled together.
Figure 3:
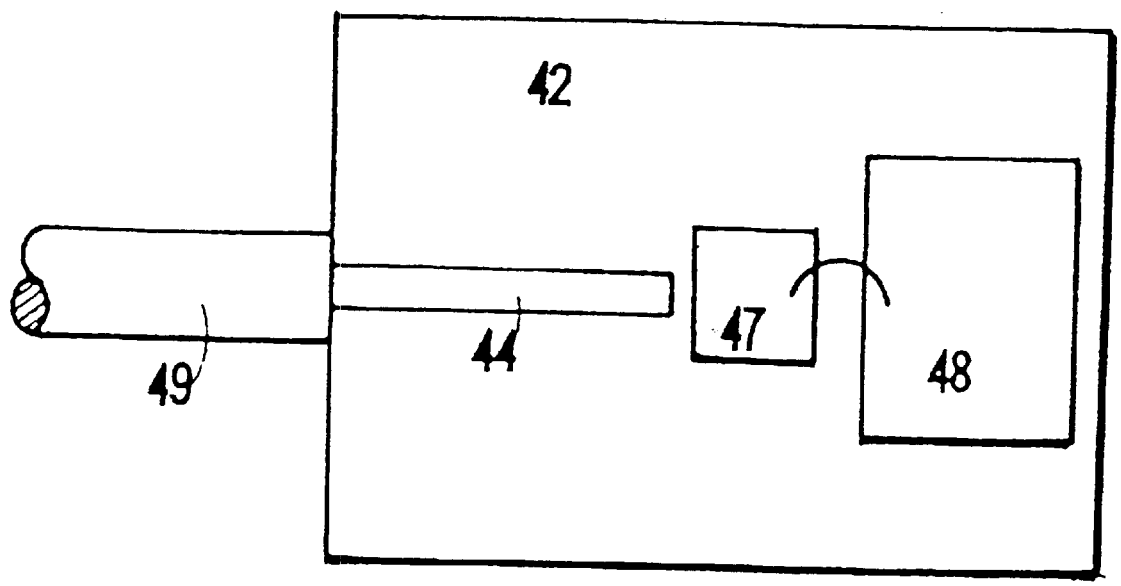
FIG. 3 is a plan view of a planar mounting type light-receiving module according to a prior art example.
Figure 4:
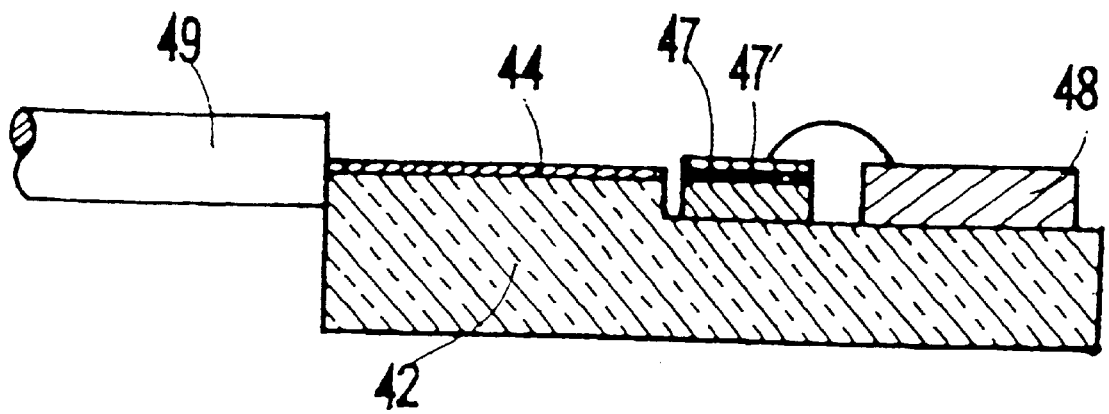
FIG. 4 is a middle longitudinally sectional view of a planar mounting type optical receiving module according to a prior art example.
Figure 9:
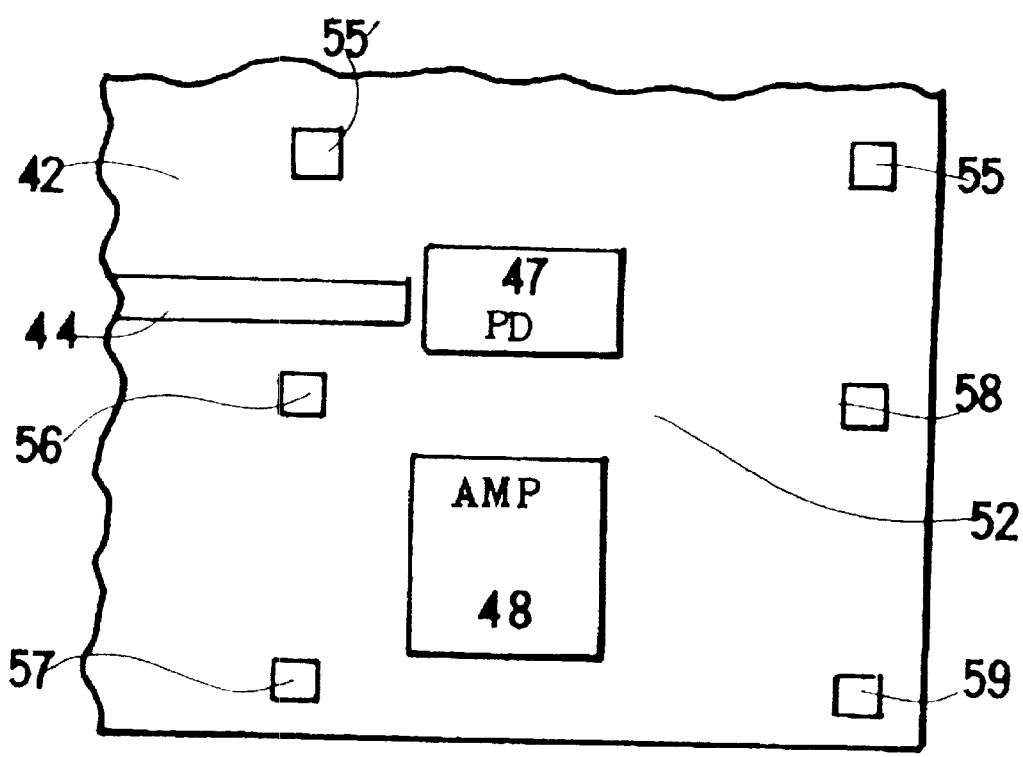
FIG. 9 is a plan view of the light receiving part of a light-receiving module according to the first and second embodiments, in which supports are provided to retain the meshed member.
Figure 10:
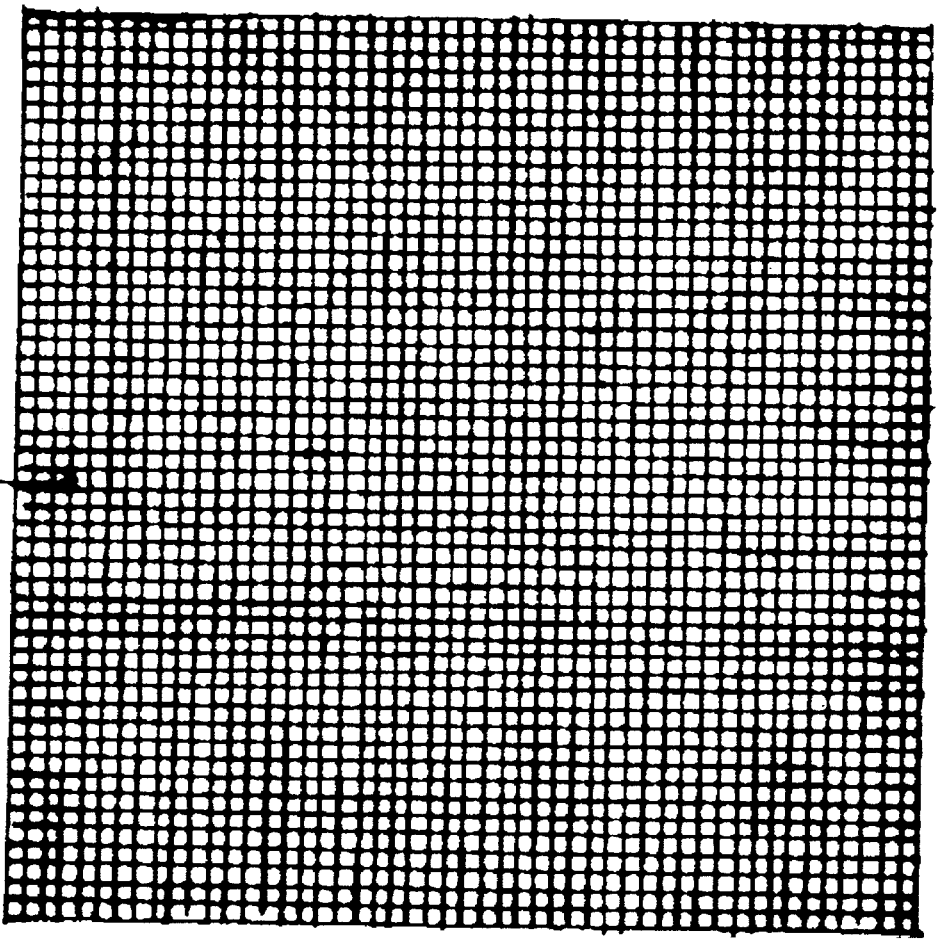
FIG. 10 is a plan view of the meshed member for covering the light receiving part in the first embodiment.
Figure 11:
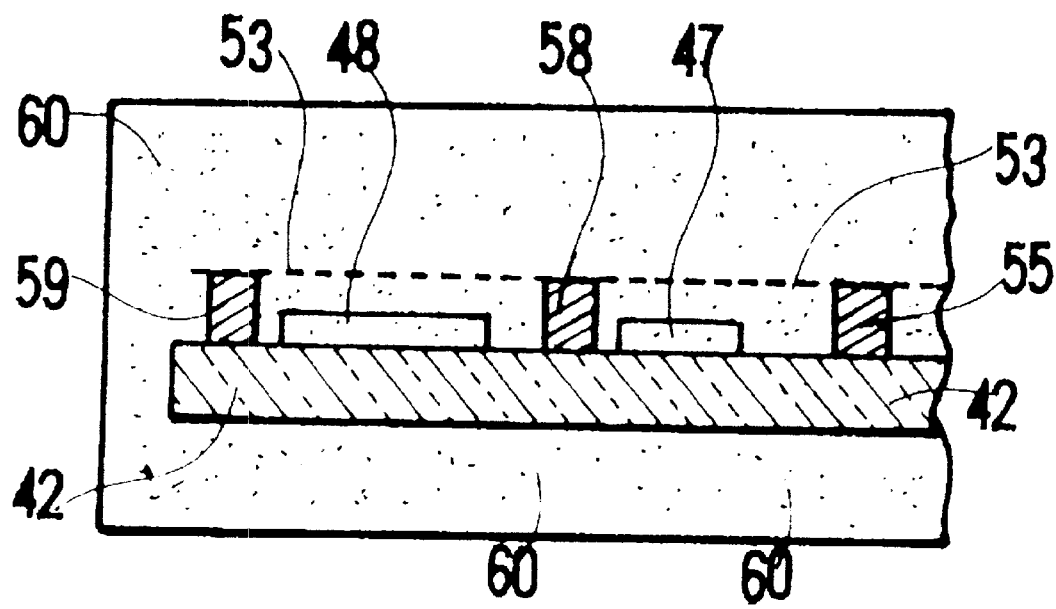
FIG. 11 is a longitudinally sectional right side view of only the light receiving part of the light-receiving module shown in FIGS. 9 and 10.
Figure 12:
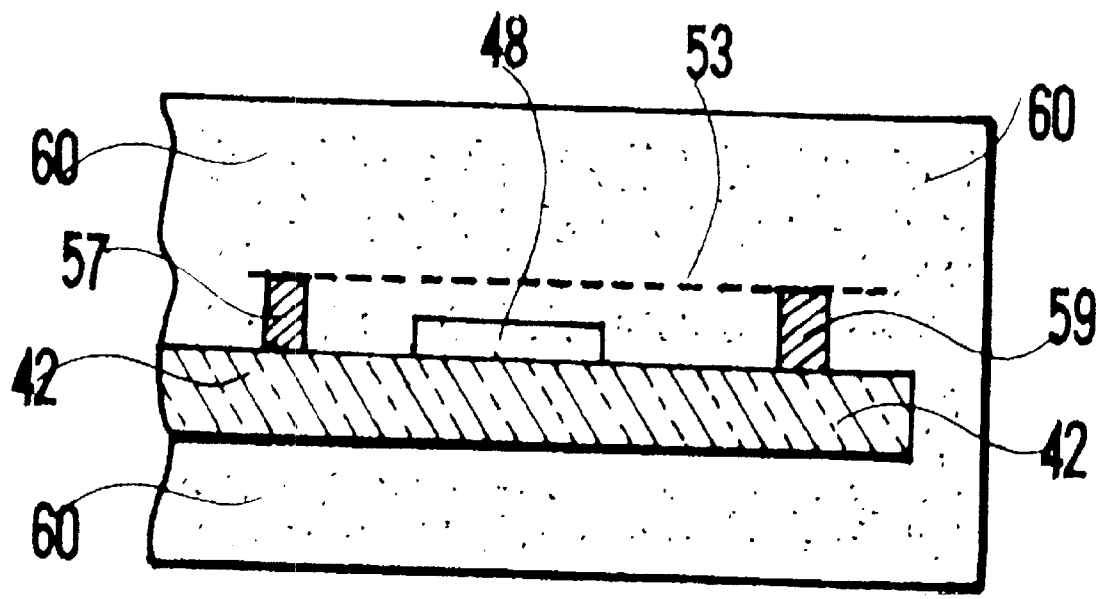
FIG. 12 is a longitudinally sectional front view of only the light receiving part of the light-receiving module shown in FIGS. 9 and 10.

Based on FIGS. 9 through 12, a description is given of an embodiment having a waveguide, in which the light receiving part is covered by a metallic meshed member. This is such that a metallic meshed shield is added to the light waveguide type illustrated in FIGS. 3 and 4, and a further detailed embodiment of FIGS. 5 and 6. In FIGS. 9, 11 and 12, an Si bench 42 is such that a transparent $SiO_2$ dielectric layer is formed on Si crystal by a sputtering method or an oxidization method. Impurities which reduce the refractive index is doped on the $SiO_2$ layer of the Si bench 42, thereby forming a waveguide 44. Although not illustrated, a metallized plane of the PD and AMP ground and other metallized planes are printed on $SiO_2$. The PD and AMP grounds are connected to the ground surface of the substrate, and these grounds are connected to an external circuit.

At the termination end of the waveguide 44, the PD chip 47 is fixed on the PD/AMP ground metallized plane. The AMP (forward amplifier) 48 is fixed on the PD/AMP ground metallized plane, drawing near the PD. The end part of the optical fiber 49 is connected to the beginning end of the waveguide 44. Light (input light) received from the optical fiber propagates from the waveguide 44 to the PD 47. A lead frame is connected to these elements by wires. However, an illustration thereof is omitted in FIG. 9. Since two elements are provided on one substrate 42, the size can be made small-sized.

Further, since the light advancing direction is parallel to the substrate and chip surface, it can be made still further small in size.

The part consisting of the PD 47 and AMP 48 is a light receiving part 52. As shown in FIG. 9, metallic supports 55, 55', 56, 57, 58 and 59 are made erect on the light receiving part 52. The supports may be made of metal such as KOVAL or stainless steel. A metallic meshed member 53 is spread and adhered to the supports 55 through 59. The meshed member 53 has a meshed structure as shown in FIG. 10. The PD 47 and AMP 48 are covered by the meshed member 53 as in FIGS. 11 and 12. The PD and AMP are connected to the ground metallized plane. Since the supports are made of metal and the meshed member 53 is also made of metal, the PD 47 and AMP 48 are set between the conductors. Further, the supports and meshed members have a ground potential, whereby electric waves cannot enter from the outside. Therefore, the light receiving part is minimally affected by external noise, and can be protected from noise from the transmitting part.

Figure 5:
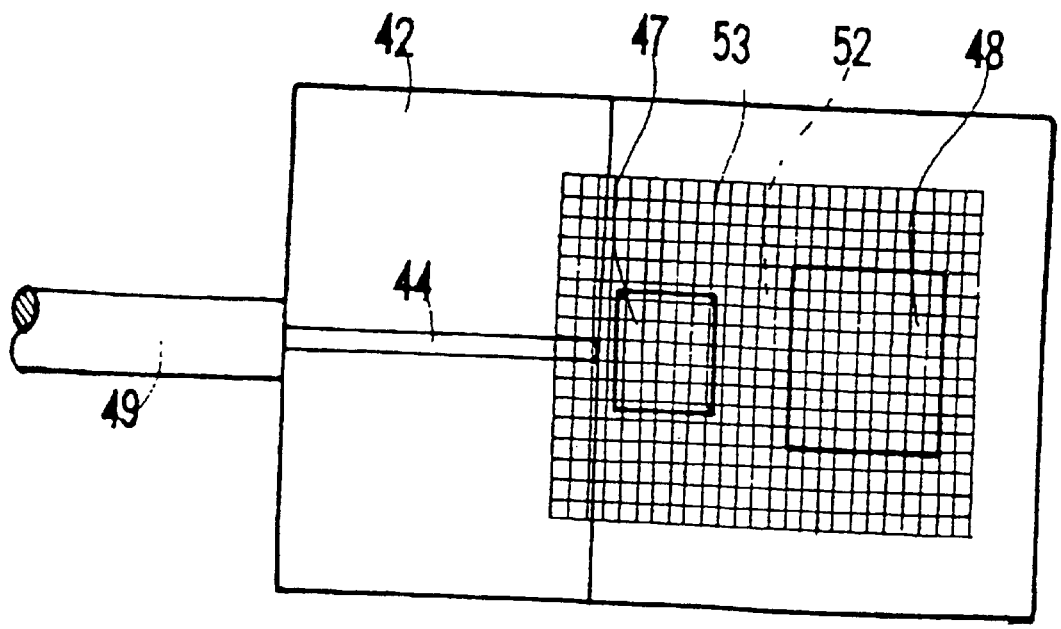
FIG. 5 is a plan view showing one embodiment of the present invention, in which a waveguide is provided on the surface layer at the middle of an Si bench, an optical fiber and PD are coupled together by the waveguide, a meshed member is provided above the PD and AMP fixed above the axial line of the bench, and the light receiving part is electrically shielded.
Figure 6:
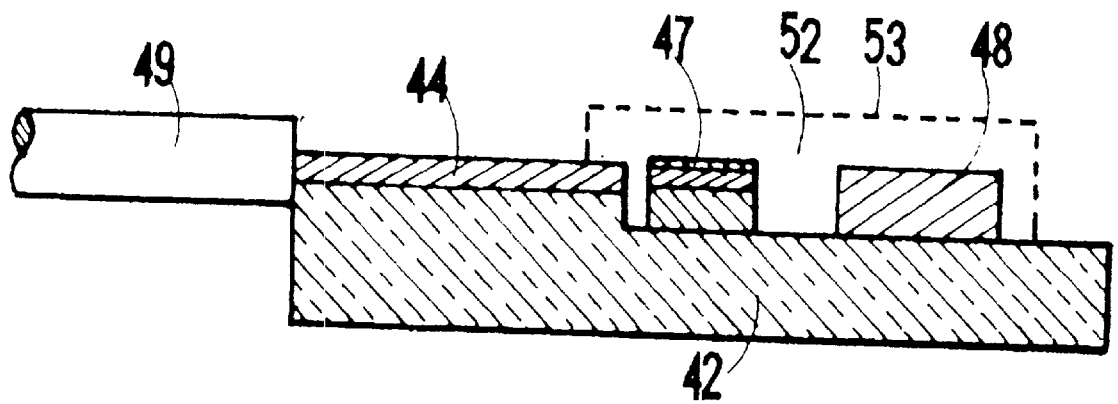
FIG. 6 is a middle longitudinally sectional view of the element shown in FIG. 5.
Figure 7:
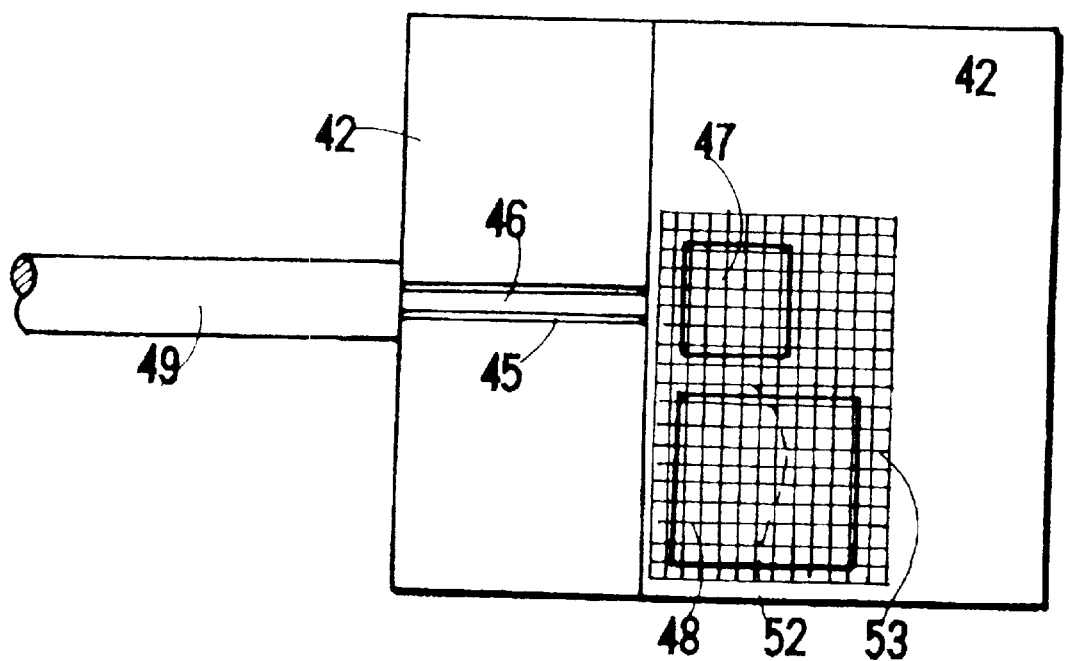
FIG. 7 is a plan view showing another embodiment of the present invention, in which a V-shaped groove is secured on the Si bench, the tip end of an optical fiber is held by a V-shaped groove, a PD is fixed at the tip end of the optical fiber while an AMP is provided at the side thereof, and the PD and AMP are covered by a meshed member.
Figure 8:
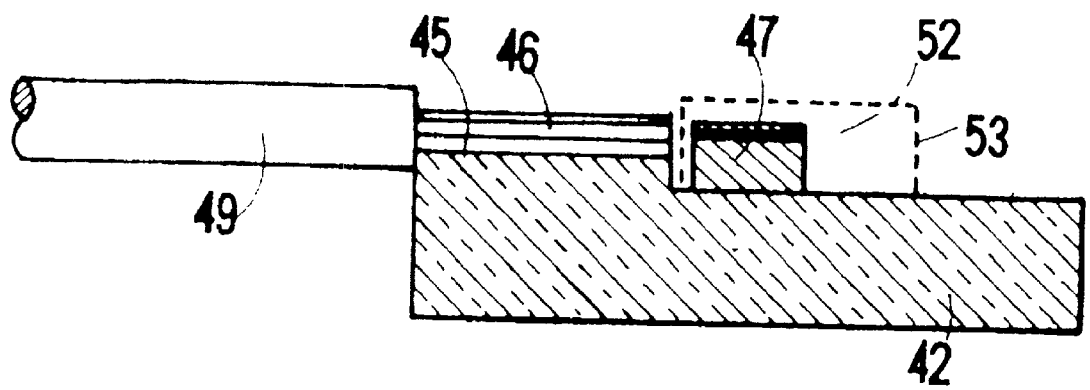
FIG. 8 is a middle longitudinally sectional view of the element shown in FIG. 7.
Figure 16:
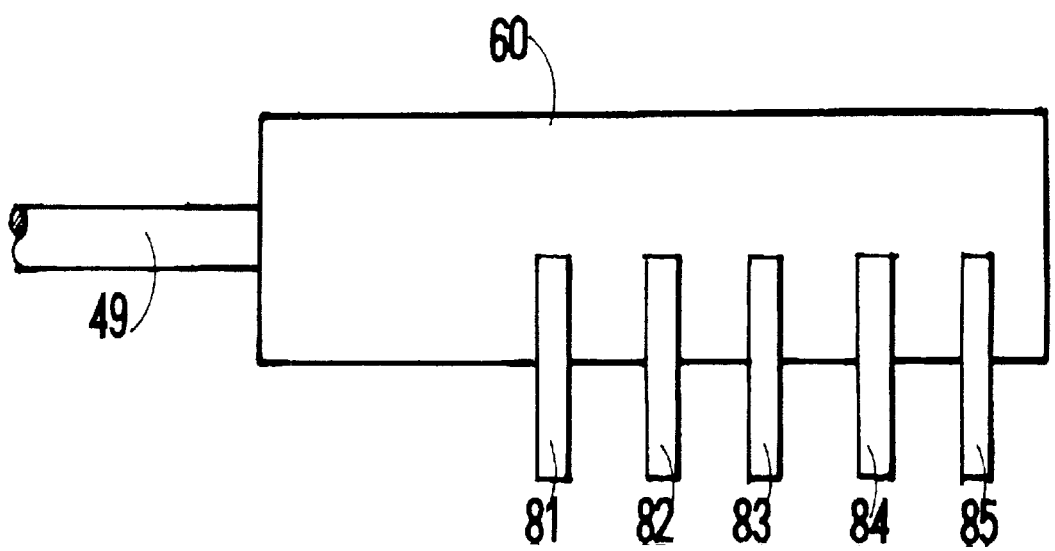
FIG. 16 is a front view of a single body light receiving part in which the Si bench of an element of the first and second embodiments is resin-molded.

The meshed member is employed so as to cause fluid resin to enter the light receiving part. In FIG. 5, FIG. 6 and FIG. 9, although an illustration of the lead frame and wires is omitted, in reality, the substrate is provided with leads and wires. Next, clearance of the light receiving part between the light waveguide or optical fiber and the PD is bonded by a light-transmitting resin. Since light passes through the portion, it must be a light-transmitting resin. Thereafter, they are placed in a mold into which resin 60 is poured, and solidifies therein. The operation is called "molding". The resin itself may be called "molding". The resin may not be transparent. For example, by mixing resin with a pigment, it may be blackened. FIGS. 11 and 12 are cross-sectional views showing only the light receiving part after the molding is completed. Although there are supports 55 through 59 on the Si substrate 42 and the meshed member 53 thereon, the resin 60 passes through the meshed member 53 and seeps into the underside of the meshed member 53 to fill up the light receiving part without any clearance. A function of the resin 60 is to protect the elements and substrate by covering them and to make a package that prevents the permeation of water and gas. FIG. 16 is a front view of the entirety of a light-receiving module element. This becomes an element of a plastic package (DIP) having pins at both sides. Pins are optionally disposed. This is similar to a state in which one end of the optical fiber is buried inside the plastic mold. The meshed member is hidden inwardly, wherein the meshed member is not exposed to the outside. That is, the module is equivalent to a conventional integrated circuit, except that it is provided with an optical fiber. Therefore, it is very easy to handle.

A description is given of functions. The light receiving part is likely to be influenced by electric waves from the outside since it has a high amplification ratio and high impedance. However, since the light receiving part is surrounded by a ground potential metal such as a metallic ground plane, supports, and meshed member, no electric wave enters the inside. Resin can be supplied without any clearance when carrying out resin molding from the rear side, using the supports and meshed member. Therefore, the resin molding provides a small-sized and inexpensive light-receiving module having high performance.

FIG. 16 is a front view of a single body light receiving part in which the Si bench of an element of the first and second embodiments is resin-molded. Leads 81–85 are visible on the resin 60, and are used for connection to the external circuit.

EMBODIMENT 2

Metallic Plate+Support: Light Waveguide Type

Figure 13:
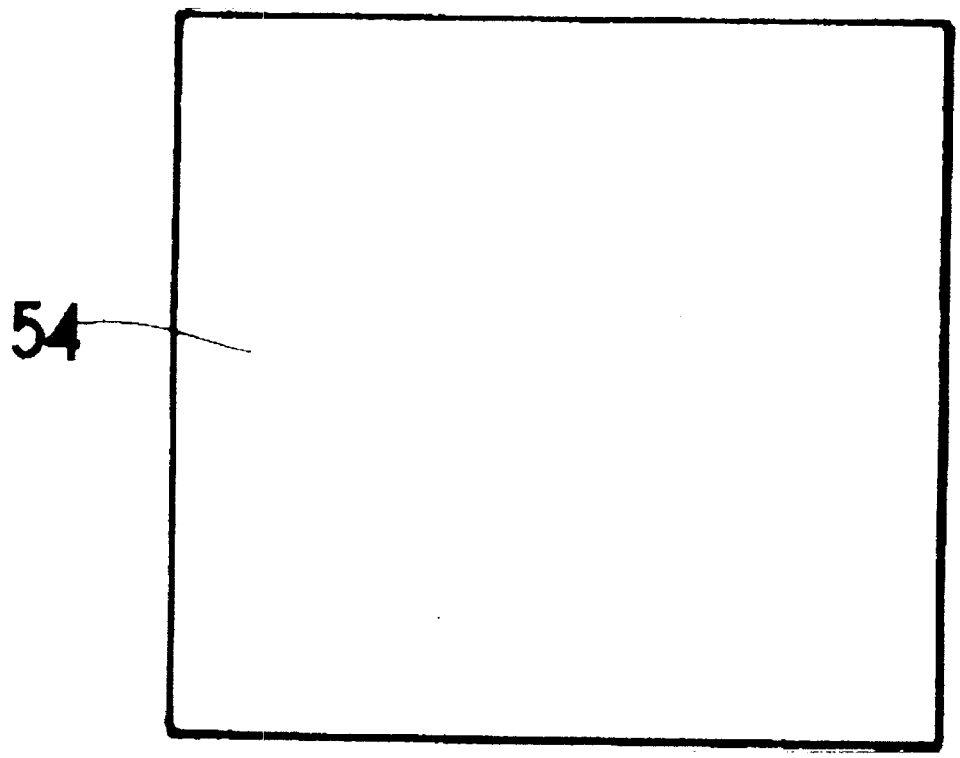
FIG. 13 is a plan view of a planar metallic plate to cover the light receiving part in the second embodiment of the invention.
Figure 14:
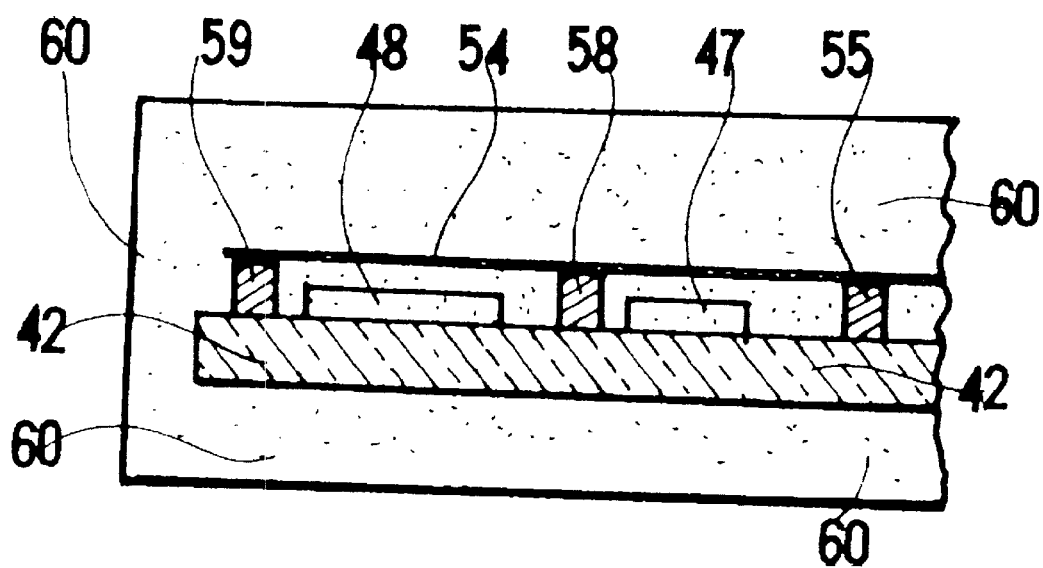
FIG. 14 is a longitudinally sectional right side view of only the light receiving part covered by a planar metallic plate according to the second embodiment.
Figure 15:
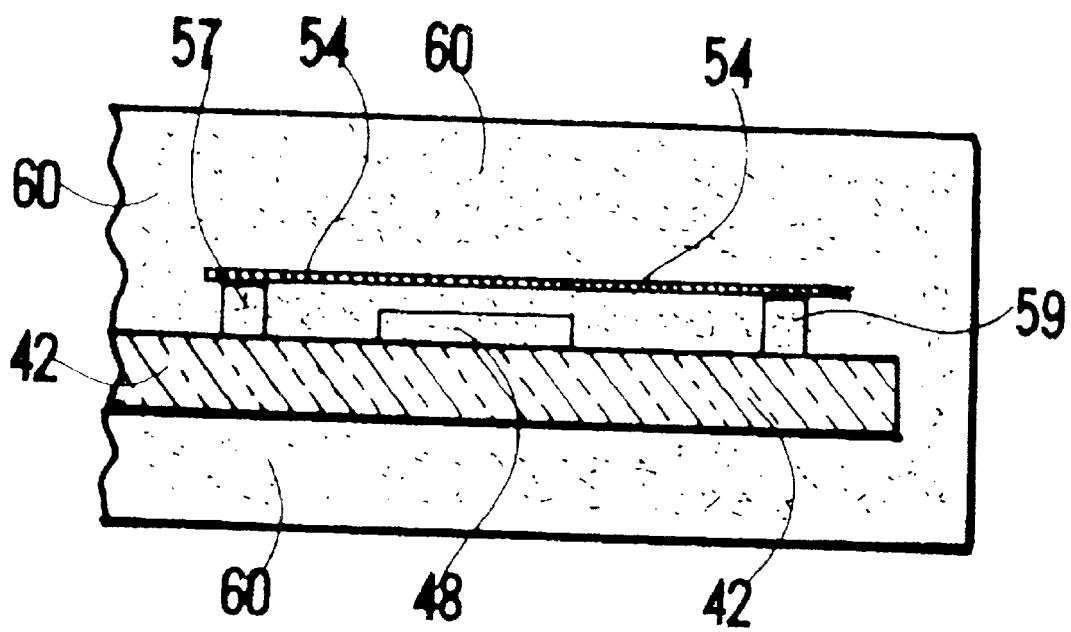
FIG. 15 is a longitudinally sectional front view of only the light receiving part covered by a planar metallic plate according to the second embodiment.

In the first embodiment, the light receiving part is electrically shielded by a meshed member. However, the light receiving part may be shielded by a pore-free (blink) metallic plate. Any plate which permits resin to be inserted into the light receiving part may be used. FIGS. 13 through 15 show a second embodiment. A plan view of the element before attaching a plate is the same as that in FIG. 9. A metallic plate 54 is adhered to the supports 55 through 59 as opposed to the meshed member 53. FIG. 13 shows a metallic plate 54 of a blink plate. FIG. 14 is a longitudinally sectional front view, and FIG. 15 is a longitudinally sectional side view. Clearance exists between the metallic plate 54 and the supports, through which resin may permeate the interior. The interior of the light receiving part is covered with resin, and the metallic plate 54 covers the PD and AMP, whereby the PD and AMP are protected from external noise. This contributes to excellent shielding effects than that of the meshed member.

EMBODIMENT 3

Porous Metallic Plate+Supports: V-grooved Type

Figure 17:
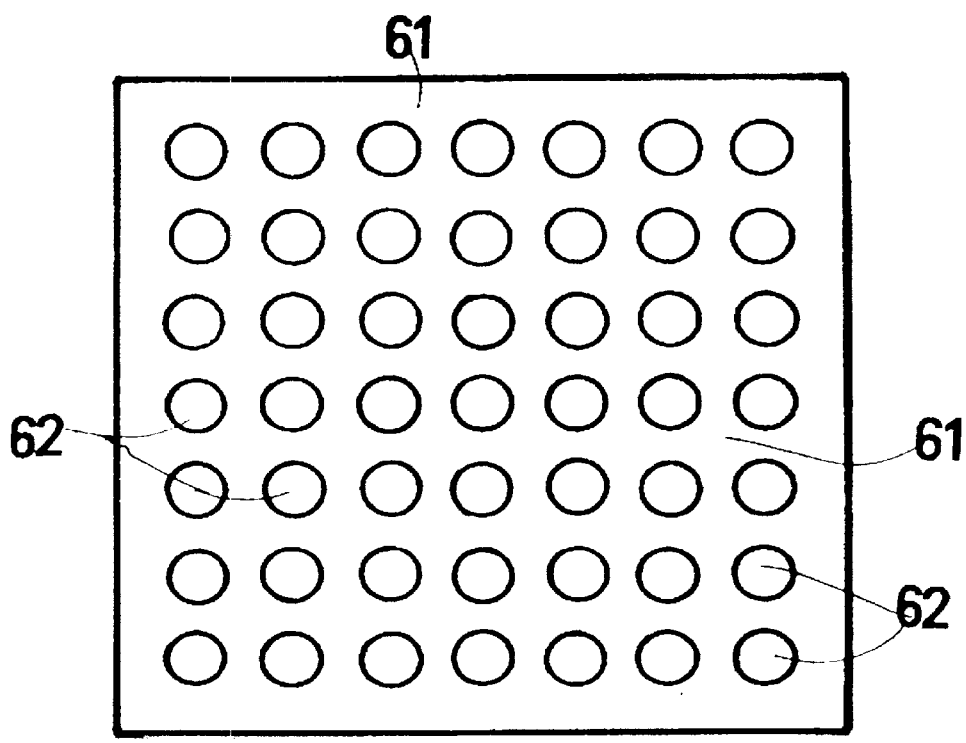
FIG. 17 is a plan view of a porous metallic plate to cover the light receiving part in the third embodiment.

Although a metallic meshed member 53 is used in the first embodiment and a blind metallic plate 54 is used in the second embodiment, a porous metallic plate 61 such as a stainless steel plate may be used. The porous metallic plate must have openings through which resin can permeate to the interior. FIG. 17 shows the porous plate 61. This is a metallic plate having a number of pores 62 with an adequate diameter in a lateral and longitudinal plane of the plate. This is an example for attaching and fixing a porous metallic plate at the supports as opposed to the meshed member 53 and metallic plate 54. The function of shielding the noise of the transmitting part is unchanged.

Figure 18:
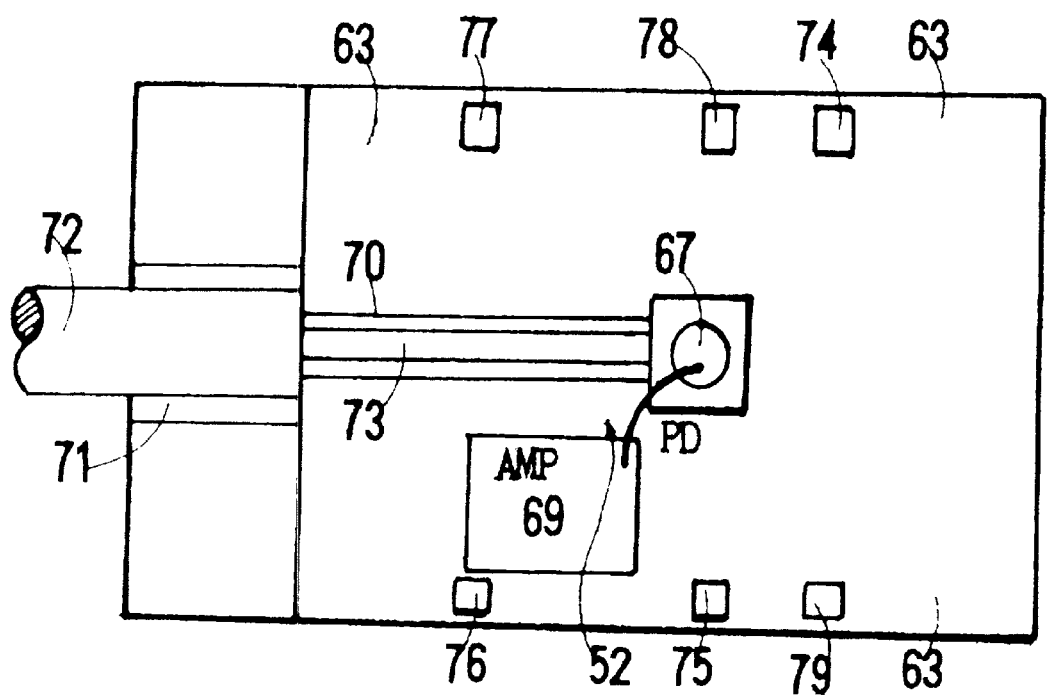
FIG. 18 is a plan view of the third embodiment (V-grooved type) in a state where a V-shaped groove is formed on a platform, an optical fiber end is fixed therein, a PD and an AMP are provided, and supports are attached at the surrounding of the light receiving part.
Figure 19:
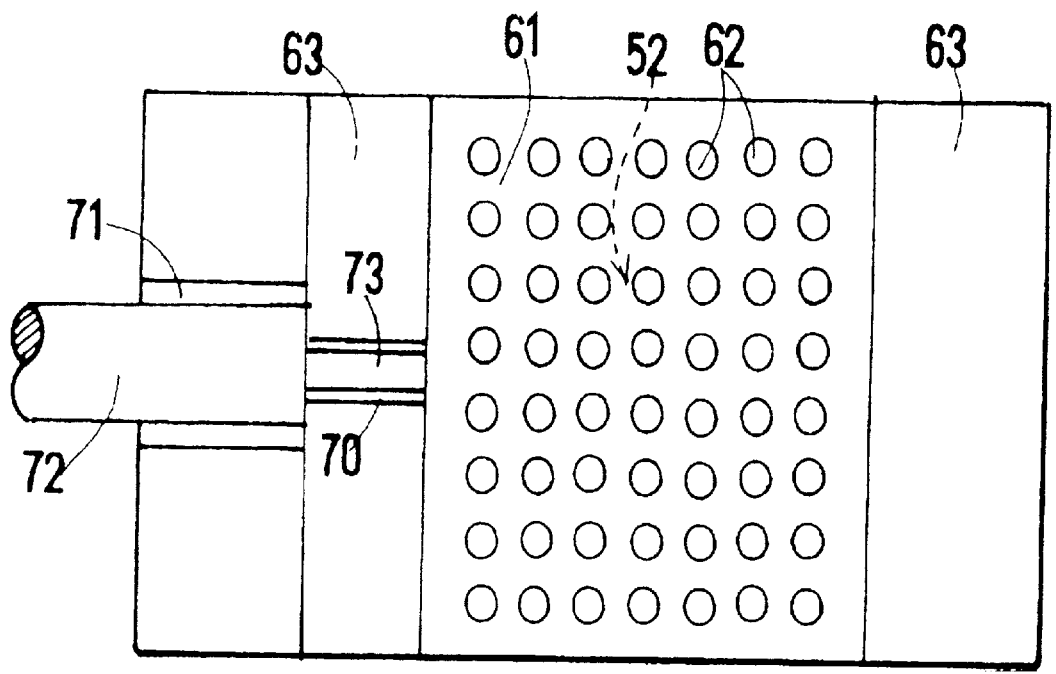
FIG. 19 is a plan view of the third embodiment in a state where a porous metallic plate is fixed on the supports appearing in FIG. 18.
Figure 20:
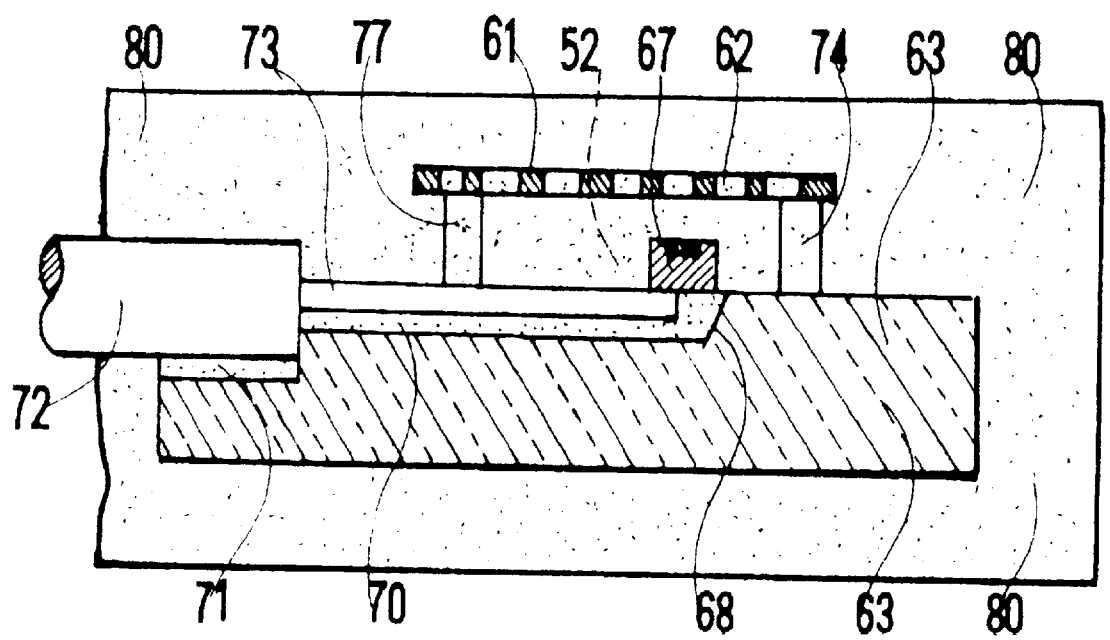
FIG. 20 is a partially longitudinally sectional view of the third embodiment in which the entirety of the platform in FIG. 19 provided with a porous metallic plate is resin-molded as a light-receiving module.

FIGS. 18 through 20 show an example of covering the light receiving part by holding a porous metallic plate by supports. FIG. 18 is a plan view showing a state where optical fibers and elements are disposed on a Si bench (platform) 63. The Si bench is a rectangular (001) Si single crystal base plate. In an optical fiber 72, the sheath of the tip end part thereof is unsheathed to cause a part of its ribbon to be exposed. The optical fiber 72 itself is fixed in a V-shaped groove 71, and the ribbon is fixed in a small V-shaped groove 70. The termination end of the small V-shaped groove 70 has an inclined wall 68 formed by anisotropic etching of Si, and the inclined wall functions as a reflection mirror.

A receiving PD 67 is provided in front of the reflection mirror plane 68 at the termination end of the small V-shaped groove 70. The inclination angle of the reflection mirror plane 68 is, for example, 54.7 degrees. The received light is reflected diagonally upwards by the reflection mirror plane 68 and is caused to enter the PD from the rear side. Space from the end face of the optical fiber to the reflection mirror plane and PD is filled up with a light transmitting resin. An Amplifier (AMP) 69 is fixed in the vicinity of the PD 67. The amplifier 69 amplifies photocurrents of the PD 67 beforehand. The PD 67 and AMP 69 constitute a light receiving part 52. A porous metallic plate 61 is held by supports 74 through 79 so that it completely covers the light receiving part.

A description is given of a method for producing a light-receiving module with a shielding plate shown in FIGS. 18 through 20. Two types of V-shaped grooves are formed by anisotropic etching on the centerline of a Si bench having a (001) plane, which is approximately 10 mm×5 mm. The anisotropic etching is described below. Since the Si bench 63 is of a single crystal (001), it can be exposed by {111} by an etching solution whose etching speed is in the direction of {111} plane. The groove becomes a V-shaped groove in which a (1-11) plane and a (-111) plane are combined, wherein the inclination angle is 54.7 degrees; the angle notched by the valley is 70.5 degrees. A shallow small V-shaped groove 70 is provided in the vicinity of the PD 67, and a large V-shaped groove 71 is prepared at the optical fiber side. An inclined plate 68 having an angle of 54.7 degrees is brought about at the termination end of the small-V-shaped groove 70.

A metallized pattern is printed or provided by photolithography on the Si substrate. The receiving PD and AMP are drawn near each other and fixed on the ground metallized plane. The PD is an InGaAs-PD. The AMP is an element for amplifying PD signals. There are metallized patterns for wiring in addition thereto. An illustration of these metallized patterns is omitted. Electrode pads of the PD 67 and AMP 69, and metallized patterns are connected by wires.

Supports 74 through 79 made of stainless steel, KOVAL, etc., are fixed on the ground plane of the light receiving part. The supports have a ground potential. In this example, the supports 74 through 79 are made of stainless steel and are 0.5 mm×0.5 mm×1 mm high. The height is particularized because the height (thickness) of the PD chip is thin, for example, approx. 0.2 mm through 0.3 mm. As shown in FIGS. 19 and 20, a porous metallic plate 61 is cemented onto the supports 74 through 79. This is because of the shielding of the PD part, which is an object of the invention.

In this example, the porous plate is made of stainless steel, and is 0.1 mm thick laterally and 4.5 mm wide longitudinally. The pores are prepared by etching. It may be prepared by presswork. The pore diameter may be made as small as possible provided that resin could pass through. For example, the pore diameter is 0.3 mm. FIG. 19 shows a state where a porous plate is attached. The entire receiving portion is covered by the porous plate 61.

The Si bench is fixed at the middle part of a lead frame, wherein lead pins and metallized wires are connected by wire bonding. A part of the tip end part of the optical fiber 72 is unsheathed to expose the ribbon 73 (cladding+core: for example, 125 μm dia.). The ribbon 73 is placed in the small V-shaped groove 70, and the sheathed part (for example, 0.9 mm dia.) is inserted into the large V-shaped groove 71. Therefore, the optical fiber 72 is fixed in the V-shaped grooves 70 and 71, whereby the alignment thereof can be automatically secured.

Also, the entirety thereof is molded by a non-transparent resin 80. The state is shown in FIG. 20. Since there are a number of pores 62 in the porous metallic plate 61, resin having fluidity can pass through the pores and enter the light receiving part 52. The resin can enter through the clearance between the supports, whereby the resin is filled into both the inside and outside of the shielding portion at almost the same density. There is no harm even though air gaps remain internally. The shielding member is constructed of a meshed member or a porous plate to mold the interior of the shielding member by subsequent injection of resin.

If there is no gap between the PD and the reflection mirror plate or optical fibers, the entirety may be hardened by a single resin. If there is any gap between these optical components, transparent resin is inserted into the gap between the PD and reflection mirror plane, and between the optical fibers and waveguide. The transparent resin may be, for example, a silicone resin.

For example, epoxy resin having an excellent hardening property may be used as a molding resin 80. The resin 80 is used to mold the entirety, and the lead frame is also supported by the resin 80. Since a plastic package (resin mold) is used, production cost can be remarkably reduced in comparison with ceramic packages or metallic packages.

Figure 21:
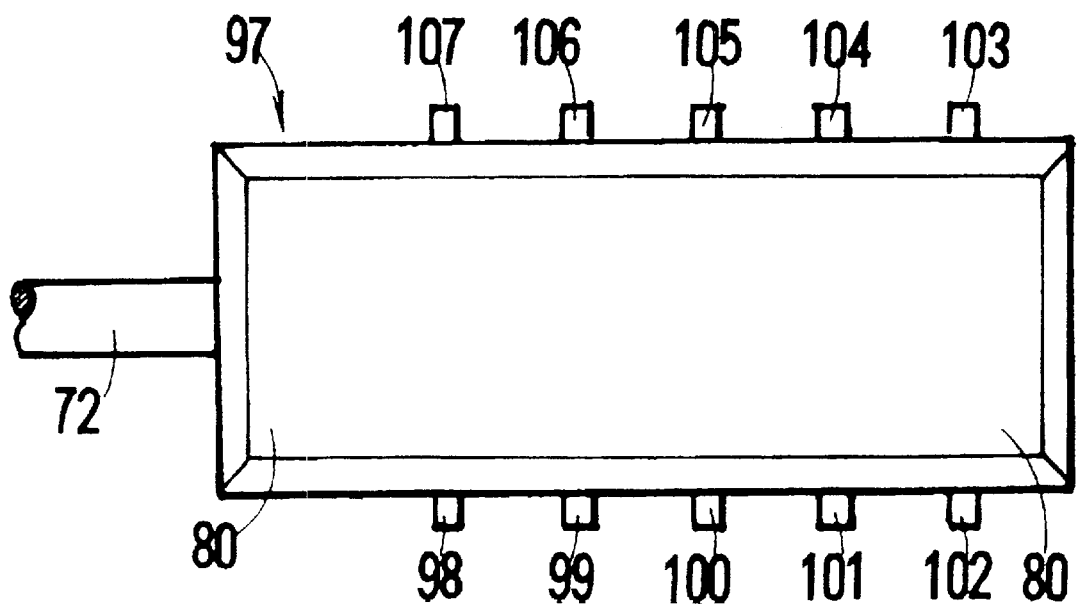
FIG. 21 is a plan view of the appearance of the element that is completed by molding the entirety of the third embodiment shown in FIGS. 18 through 20.
Figure 22:
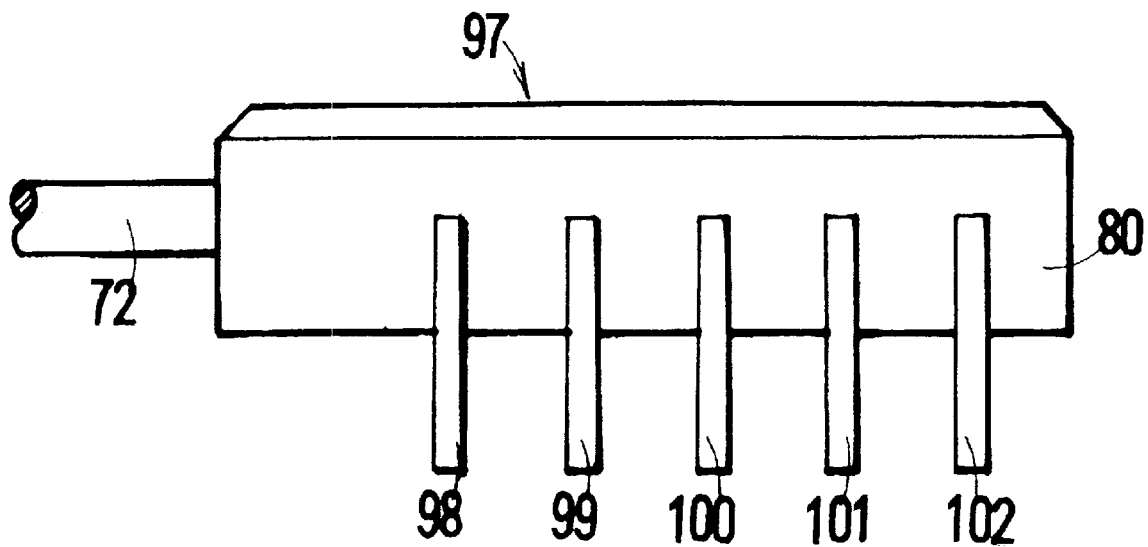
FIG. 22 is a front view of the appearance of the element completed by molding the entirety of the third embodiment shown in FIG. 18 through FIG. 20.
Figure 23:
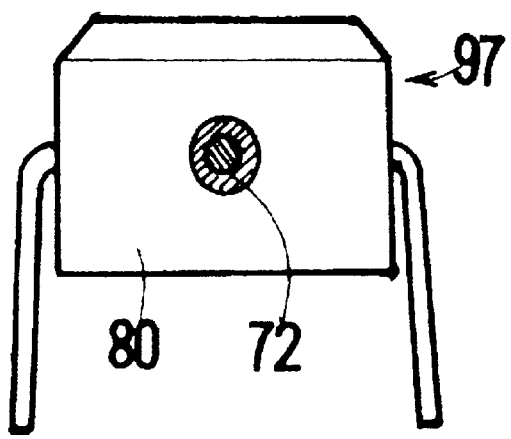
FIG. 23 is a left side view of the appearance of the element completed by molding the entirety of the third embodiment shown in FIGS. 18 through 20.

FIG. 21 is a plan view of a completed element. FIG. 22 is a front view, and FIG. 23 is a left side view. Although the element is provided with an optical fiber, it is a conventional DIP type plastic package element.

Lead pins 98 through 107 are used to connect the internal PD and AMP to external circuits. The number of pins may alternate to be more or less, depending on the internal circuits. For example, the number of pins is determined as shown below; 1 pin for the PD and AMP ground, 1 pin for bias of a detecting PD, and 2 pins for the AMP. More pins are required if two or three pins are prepared for the ground, or the AMP power source is constructed out of a two-power source type. Herein, a 10-pin type is illustrated. In the plastic package (mold), the side corners are rounded. However, it is not necessary to round the side corners.

The receiving module of this example is a resin mold type. However, the minimum receiving sensitivity is −35 dB or so by virtue of the shielding plate 61 (and the supports and ground metallized plane) when transmitting at a rate of 155 Mbps even though the entire module is not accommodated in a shield casing. This means that the light receiving part is protected from external noise.

This is only one example. The effect of the invention is the same as in a light-receiving module consisting of a plurality of optical fibers, in which pairs of PD and AMP are arranged in parallel.

EMBODIMENT 4

Porous Metallic Cover (Without any Support): V-grooved Type

Figure 24:
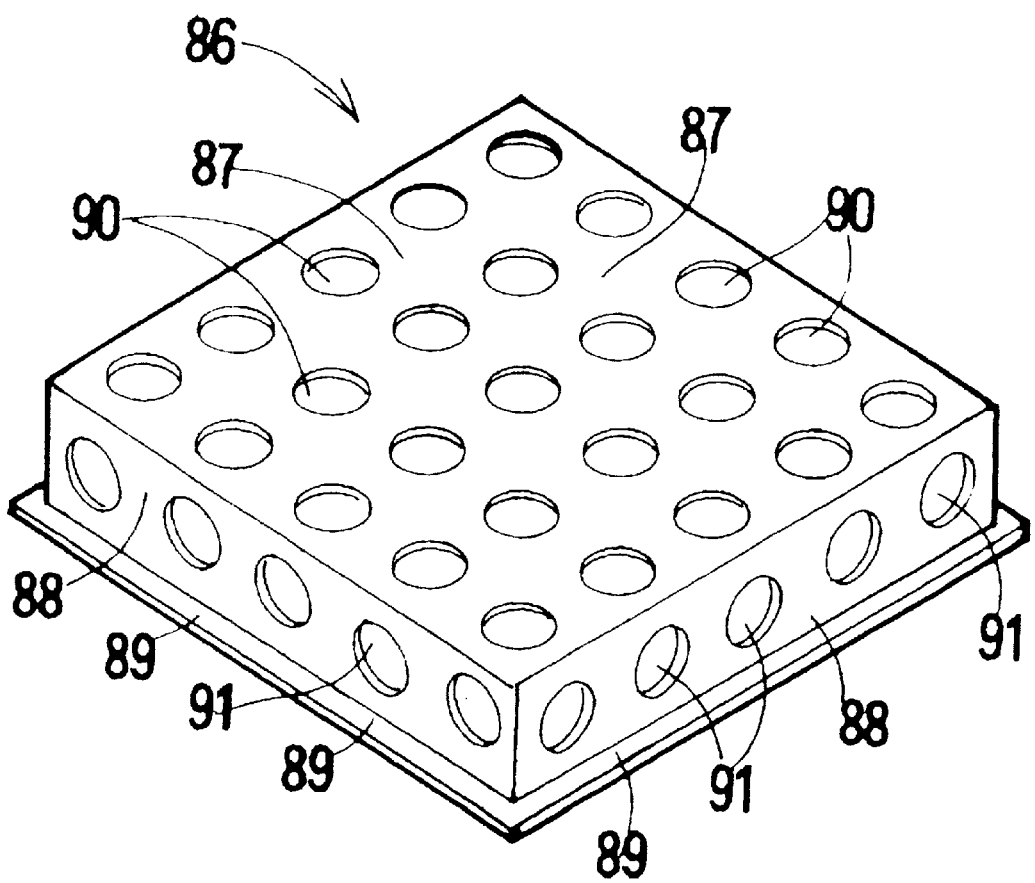
FIG. 24 is a perspective view of a box-like porous metallic plate to cover the light receiving part in the fourth embodiment.

FIGS. 24 and gives an example in which the light receiving part is shielded by a porous metallic cover molded to be box-like without the use of any support. This example is almost the same as the third embodiment. However, the shielding structure is still further sophisticated. A porous metallic cover 86 in which four sides of a porous plate as in FIG. 24 are folded is used without the use of any support.

The porous metallic cover 86 is constructed of a thin plate, which has a top ceiling plate 87, side plates 88, and a folded-over edges 89. The top ceiling plate 87 is provided with a number of pores 90. The side plates 89 are also provided with a number of pores 91. For example, the porous metallic plate 86 is, for example, a stainless steel thin plate (0.1 mm thick), 4.5 mm×4.5 mm×1 mm high. The pores 90 and 91 permit resin to pass therethrough.

Figure 25:
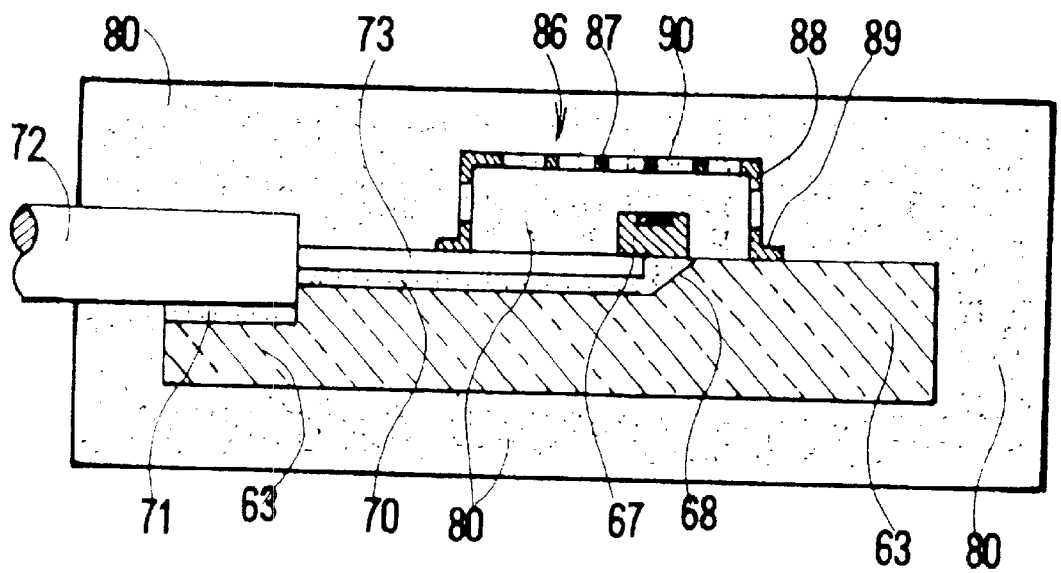
FIG. 25 is a longitudinally sectional view of the fourth embodiment, in which a V-shaped groove is formed on the Si platform (Si bench), an optical fiber end is fixed therein, a PD and an AMP are provided, and the light receiving part is electrically shielded by a porous metallic plate.

FIG. 25 is a cross-sectional view of a light-receiving module in which the light receiving part is covered by a porous metallic plate. The drawing is almost the same as FIG. 20. That is, the example shown in FIG. 25 differs from that shown in FIG. 20 in that the edges 89 of the porous plate 86 are directly soldered to the PD and AMP ground metallized plane. All the other structures are identical to each other. The Si bench is provided with a staged portion, and an optical fiber 72 and ribbon 73 are fixed in the V-shaped grooves 71 and 70. PD 67 is attached immediately above the reflection mirror plate 68 formed simultaneously with the V-shaped grooves. The metallized pattern is connected to the lead frame by wires. The entirety including the Si bench and lead frame are resin-molded.

A DIP type plastic package as shown in FIGS. 21 through 23 can be obtained. Light emitted from the optical fiber is reflected by the mirror plane 68 and is caused to enter the PD located immediately thereabove.

EMBODIMENT 5

Metallic Meshed Cover (Without Supports): V-groove Type

Figure 26:
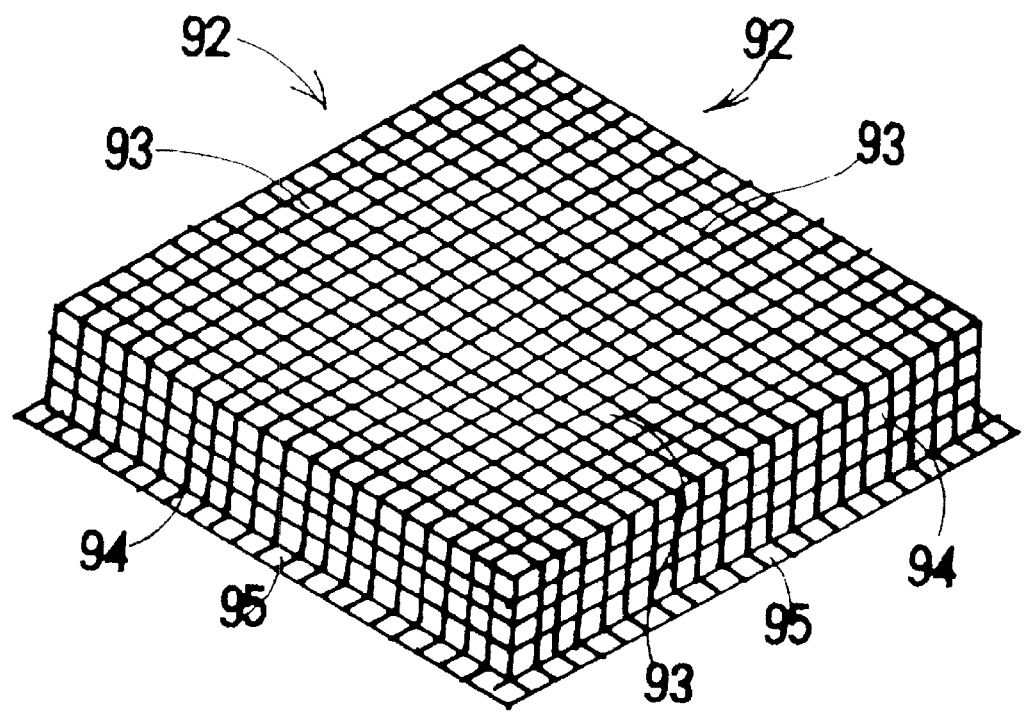
FIG. 26 is a perspective view of a box-shaped meshed covering to cover the light receiving part in the fifth embodiment.
Figure 27:
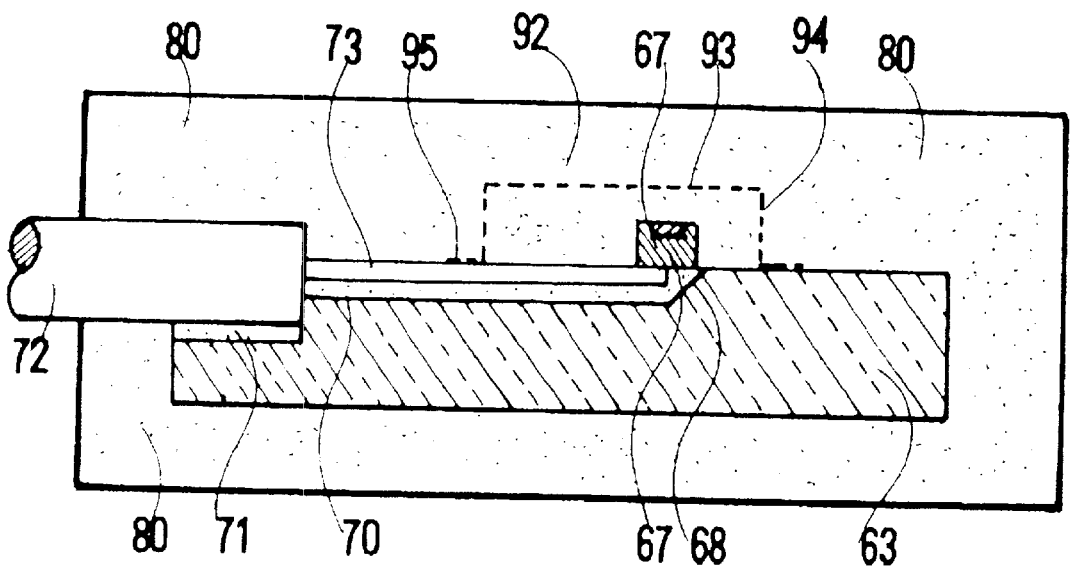
FIG. 27 is a longitudinally sectional view of the fifth embodiment, in which an optical fiber end is fixed in a V-shaped groove of the platform, a PD and an AMP are provided, and the light receiving part is electrically shielded by the box-shaped meshed cover.

FIGS. 26 and 27 gives a description of an embodiment using a metallic meshed cover. The shielding structure thereof is a metallic meshed cover 92, whereby the shielding of the light receiving part is further completed.

In this example, no support is employed. A covering body in which four sides of a metallic meshed plate is folded over as shown in FIG. 26 may be used. The profile is convenient in comparison with a meshed member 53 in FIG. 10. The meshed cover 92 has a top ceiling plate 93, side plates 94 and edges 95. A number of pores are provided on all the surfaces as a result of being meshed. It is possible to admit resin from the pores to be passed through the light receiving part.

FIG. 27 shows a cross-sectional view of a light-receiving module. The structure is almost the same as that shown in FIGS. 11 and 25. A meshed cover 92 is soldered to the light receiving part including the PD 67. Also, a Si substrate 63 and a lead frame, etc., are housed in a mold, a fluid epoxy resin is poured into the mold, and thereafter, the resin is hardened. Herein, a light-receiving module of the DIP type plastic package as shown in FIGS. 21 through 23 can be obtained.

EMBODIMENT 6

Figure 28:
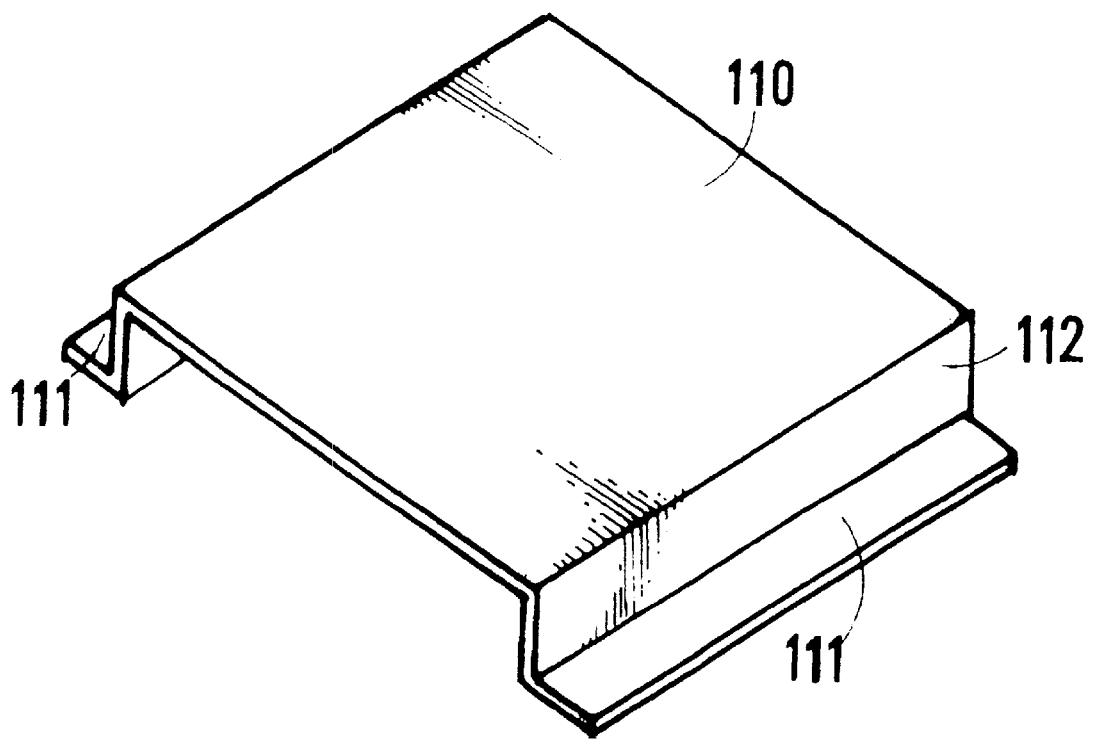
FIG. 28 is a perspective view of a double-side held and folded metallic plate to cover the light receiving part in the sixth embodiment.
Figure 29:
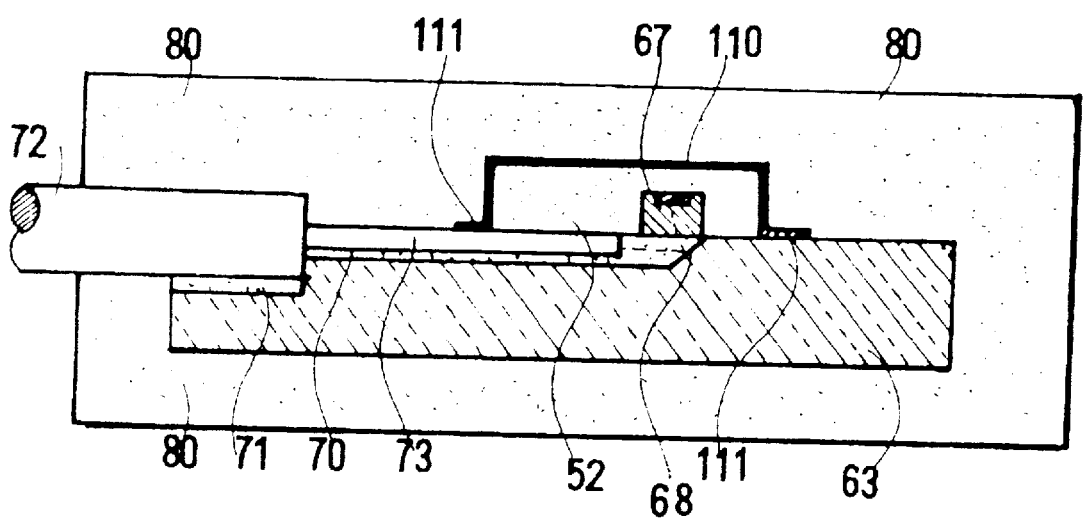
FIG. 29 is a longitudinally sectional view of the sixth embodiment, in which an optical fiber end is fixed in a V-shaped groove of the platform, a PD and an AMP are provided, and the light receiving part is electrically shielded by the double-side held and folded metallic plate.

Double-side Supported Folded Metallic Plate (Without any Supports): V-grooved Type FIGS. 28 and 29 gives a description of an embodiment employing a double side supported folded metallic plate 110. As shown in FIG. 28, a covering member whose both sides are folded to be L-shaped is used. Side plate portions 112 and leg portions 111 are provided at both sides of a folded metallic plate 110. The leg portions 111 are fixed on the ground metallized plane. The metallic plate 110 is held and supported at one side, whereby the PD is covered by a wide metallic portion. The metallic plate 110 has three open sides, through which resin can enter the interior thereof.

EMBODIMENT 7

One-side Held Folded Metallic Plate (Without any Support): V-grooved Type

Figure 30:
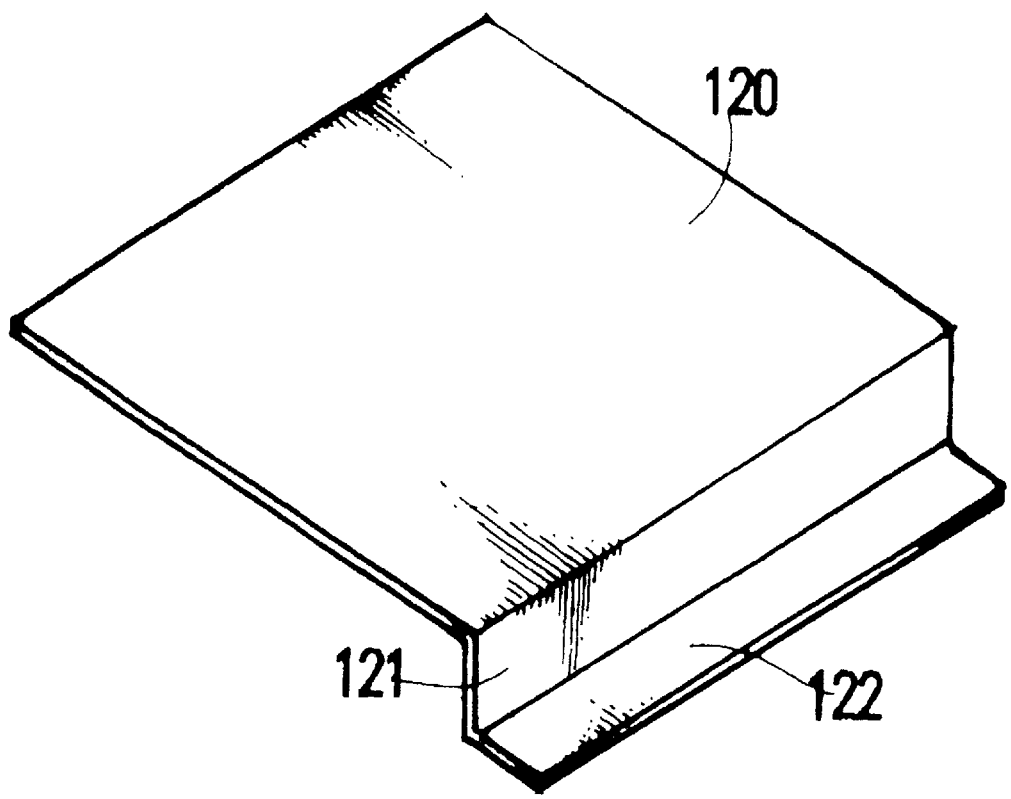
FIG. 30 is a perspective view of a single-side held folded metallic plate to cover the light receiving part of the seventh embodiment.
Figure 31:
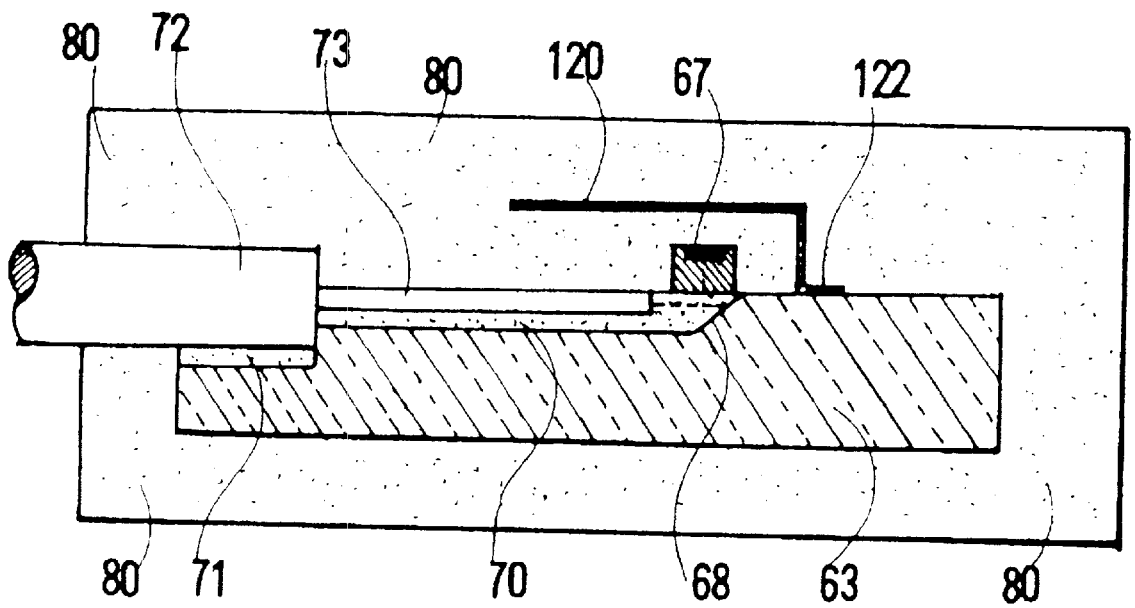
FIG. 31 is a longitudinally sectional view of the seventh embodiment, in which an optical fiber end is fixed in a V-shaped groove of the platform, a PD and an AMP are provided, and the light receiving part is electrically shielded by the single-side held folded metallic plate.

FIGS. 30 and 31 gives a description of an embodiment using a one side held folded metallic plate 120. As shown in FIG. 30, a covering body in which one end of a metallic plate is folded to be L-shaped is used. The folded metallic plate 120 has a side plate portion 121 and a leg portion 121. The leg portion 122 is fixed on the ground metallized plane. The metallic plate 120 is supported at one side, whereby the PD is covered by a wide metallic portion. Although the metallic plate 120 is a blind plate, three sides thereof are open, whereby resin can enter the interior thereof.

Herein, the above description was given of a light-receiving module having only the light receiving part. However, the present invention is applicable to a light transmitting and receiving module having a light receiving part and a transmitting part. In this case, the light receiving part is shielded by a metallic member, whereby it is possible to prevent the penetration of entrance external noise and noise of the transmitting part.

What is claimed is:

1. A light-receiving module comprising:
   a substrate having a metallized wiring;
   a light receiving part provided on the substrate;
   a light input part fixed on the substrate;
   a mechanism for connecting the light input part to the light receiving part;
   a shielding conductor having an opening through which resin passes, which covers the light receiving part, wherein the shielding conductor is a meshed metal or a metal porous plate; and
   a resin mold for shielding the substrate, light receiving part, shielding conductor and a lead frame, and for integrating the same as one unit;
   wherein said lead frame is an electrical means for external connection, and
   wherein a part of resin passes through the opening of the shielding conductor, and is solidified in the light receiving part.

2. A light-receiving module as claimed in claim 1, wherein the light receiving part consists of a photodiode and an amplifier.

3. A light-receiving module as claimed in claim 1, wherein the light input part consists of an optical fiber or a waveguide.

4. A light-receiving module as claimed in claim 1, wherein the received light is in a 1.3 $\mu$m band or 1.55 m band.

5. A light-receiving module as claimed in claim 1, wherein the substrate is a ceramic substrate or an Si substrate.

6. A light-receiving module comprising:
   a substrate having a metallized wiring;
   a light receiving part provided on the substrate;
   a light input part fixed on the substrate;
   a mechanism for connecting the light input part to the light receiving part;
   a shielding conductor having an opening through which resin passes, which covers the light receiving part, wherein said shielding conductor is such that a metal flat plate is folded and a grounding piece is secured at one side or both sides of the shielding part thereof; and
   a resin mold for shielding the substrate, light receiving part, shielding conductor and a lead frame, and for integrating the same as one unit;
   wherein said lead frame is an electrical means for external connection, and
   wherein a part of resin passes through the opening of the shielding conductor, and is solidified in the light receiving part.

7. A light-receiving module as claimed in claim 6, wherein the light receiving part consists of a photodiode and an amplifier.

8. A light-receiving module as claimed in claim 6, wherein the light input part consists of an optical fiber or a waveguide.

9. A light-receiving module as claimed in claim 6, wherein the received light is in a 1.3 $\mu$m band or 1.55 $\mu$m band.

10. A light-receiving module as claimed in claim 6, wherein the substrate is a ceramic substrate or an Si substrate.

* * * * *